United States Patent [19]

Stackhouse et al.

[11] Patent Number: 4,519,090
[45] Date of Patent: May 21, 1985

[54] TESTABLE TIME DELAY

[75] Inventors: Kenneth B. Stackhouse; William D. Hill, both of San Jose, Calif.

[73] Assignee: General Electric Company, San Jose, Calif.

[21] Appl. No.: 402,323

[22] Filed: Jul. 27, 1982

[51] Int. Cl.³ .................... G06F 11/00; G06M 3/02
[52] U.S. Cl. ........................ 377/29; 377/19; 377/107; 377/39; 371/61; 371/62
[58] Field of Search .............. 377/28, 29, 30, 39, 377/19; 371/61, 62

[56] References Cited

U.S. PATENT DOCUMENTS

| | | | |
|---|---|---|---|
| 3,845,282 | 10/1974 | Mattson | 377/30 |
| 3,934,131 | 1/1976 | Perschy | 371/62 |
| 4,082,218 | 4/1978 | Paulinski | 371/62 |
| 4,144,448 | 3/1979 | Piscidtta et al. | 371/61 |
| 4,223,213 | 9/1980 | Bibbee et al. | 377/29 |
| 4,336,448 | 6/1982 | Shipp et al. | 377/29 |
| 4,373,201 | 2/1983 | Bohan | 377/29 |
| 4,392,226 | 7/1983 | Cook | 371/61 |

FOREIGN PATENT DOCUMENTS 3126747 1/1983 Fed. Rep. of Germany .

Primary Examiner—John S. Heyman
Attorney, Agent, or Firm—Ivor J. James, Jr.; Samuel E. Turner; Raymond G. Simkins

[57] ABSTRACT

A testable time delay apparatus includes means for testing component operation during any stage of system function and means for continuously monitoring and testing component functions. The device is particularly useful in critical process control applications such as in a nuclear reactor control system.

2 Claims, 3 Drawing Figures

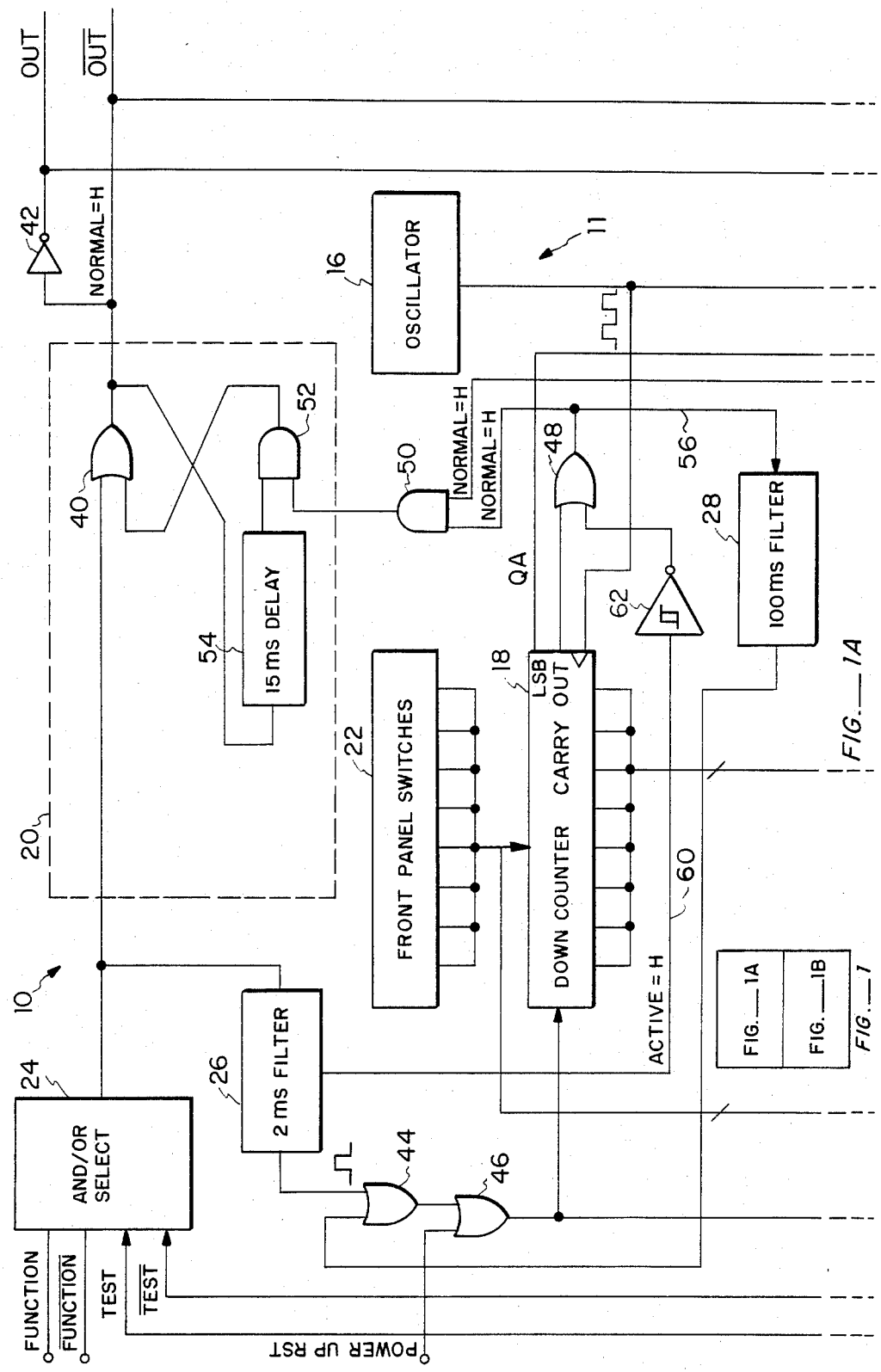

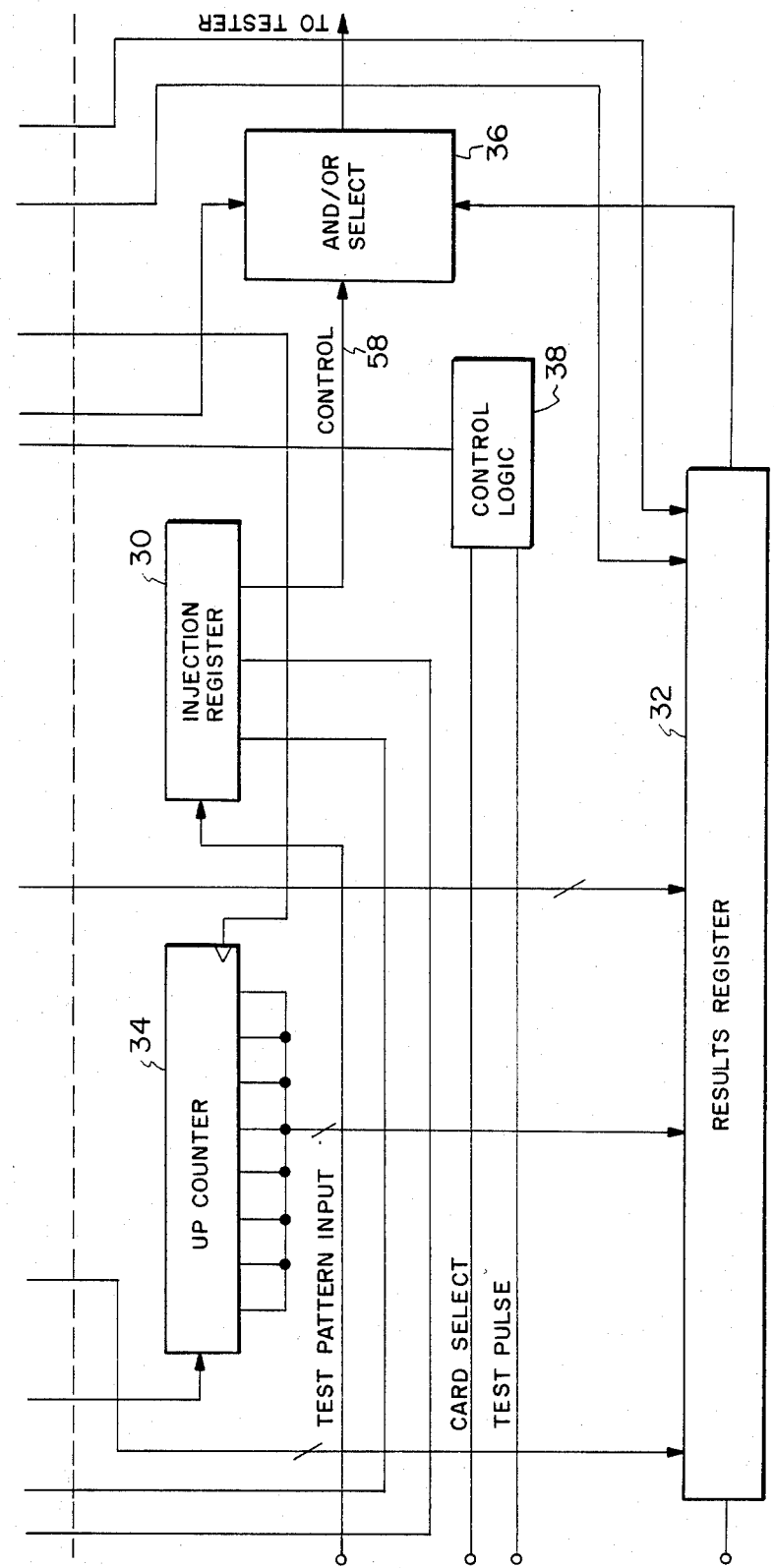
FIG._1B

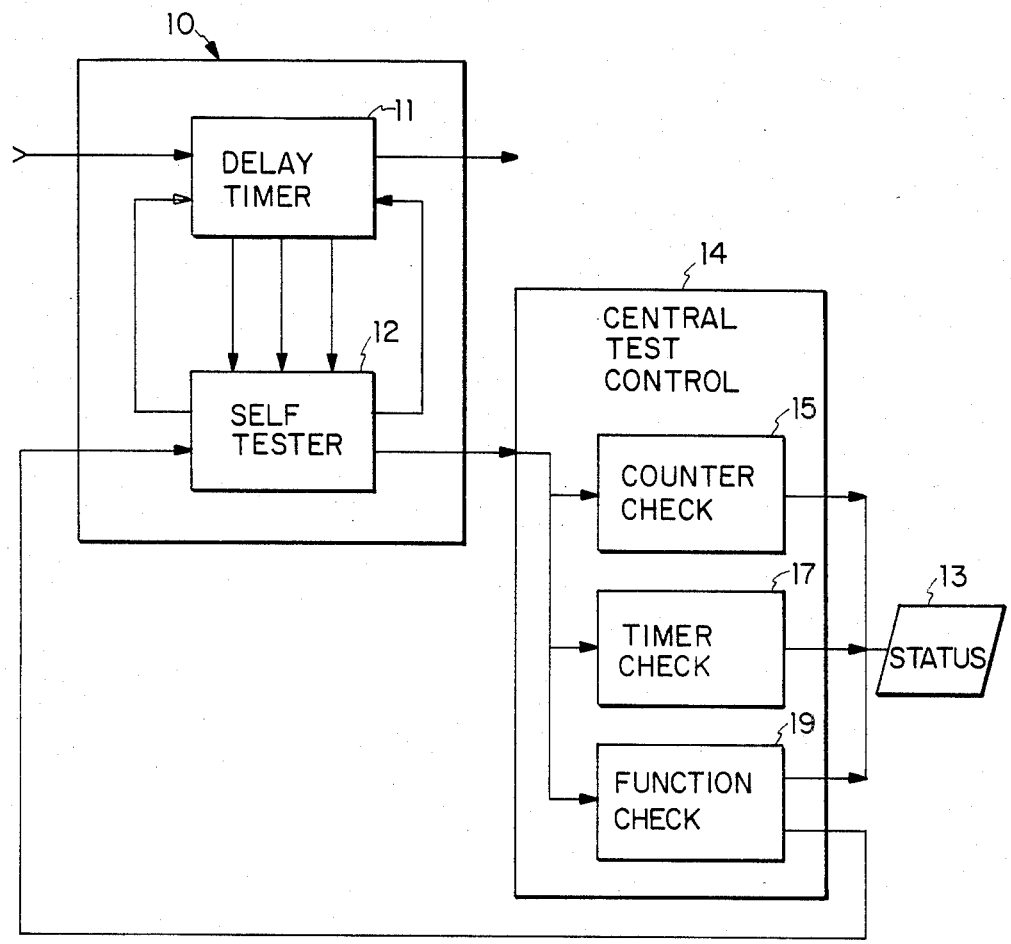
FIG._2

TESTABLE TIME DELAY

BACKGROUND OF THE INVENTION

1. Field of Invention

This invention relates to instrumentation and particularly to instrumentation in an environment requiring accurate and continuous extraction of test data during system operation. A particular application of this invention is a time delay for control and monitoring functions in an operating nuclear power plant. The invention has other applications where continuous testing and fail-safe operation are requisites.

2. Description of the Prior Art

Time delay devices are relatively well-known to the instrumentation art. Testable time delay devices are also known, all known test procedures are in some way disruptive of normal functional operation. Thus some defects in a time delay device may go undetected until on-line failure occurs. No time delay device is known which is capable of being tested at any time and specifically at any time during normal operation. Consequently extensive manual labor is now expended in frequent off-line testing of such devices.

What is needed is a time delay which is testable during its operation, and specifically a time delay device which is self testable in a manner which does not in any way disrupt normal functional operation of the device.

SUMMARY OF THE INVENTION

According to the invention, a time delay device is responsive to input function signals having a duration of at least a preselected time duration and which includes means for testing individual functions of the device either within a period shorter than the preselected functional signal duration or continuously without disrupting normal device operation. In a specific embodiment of the invention, the testable time delay includes a flip-flop with a time delayed latch, a down counter which is operative continuously in parallel with an up counter, an injection register for receiving test pattern excitation signals and a results register for temporarily storing test results.

A number of tests can be implemented under external control. For example, a transparency test can be implemented by applying a pulse through the main signal line having a duration of less than about 1 millisecond to check the integrity of the signal line, the flip-flop and the output without latching the flip-flop. In another test, a signal may be injected into the injection register and then sampled at a predetermined interval, for example, 800 microseconds after the injection signal, to test overall operation of the functional components of the device. The device may be interconnected with a central test control system whereby test routines are implemented and status is monitored.

Another feature of the invention is a continuously operative timing counter. The counter is tested by continuous monitoring, and it is reset only when a valid function signal is applied to the device input.

These and other features of the invention will be apparent upon reference to the following detailed description taken in conjunction with the accompanying drawings.

BRIEF DESCRIPTION OF THE DRAWINGS

FIGS. 1A and 1B form together a schematic diagram of a testable time delay device according to the invention.

FIG. 2 is a block diagram of a testable time delay device coupled to a central test control system.

DESCRIPTION OF SPECIFIC EMBODIMENTS

The testable time delay 10 according to the invention includes two functional segments, function logic in a delay timer unit 11 controlling the time delay function and self test circuit 12 for exercising and monitoring the the time delay function. The functional logic circuit 11 comprises a 1 Hz oscillator 16, a down counter 18, a latch 20 with a built-in delay, front panel switches 22 coupled to the down counter 18, and an AND/OR select circuit 24 which is operative to receive either test signals or functional signals in either inverted or noninverted states and to produce a single signal output. In addition, there is a 2 millisecond low pass or first short pulse blocking filter 26 and a 100 millisecond low pass or second short pulse blocking filter 28. Various other gates are provided as hereinafter explained.

The self test circuit 12 comprises an injection register 30, a results register 32, a self-test up counter 34 and an output AND/OR select circuit 36. In addition, there are circuit elements for routing control logic signals, hereinafter referred to as control logic circuitry 38.

The delay timer unit 11 and the self test logic circuit 12 are coupled to each other through various power isolation techniques such that the self test circuitry by definition cannot degrade the operation of the functional logic circuitry.

The front panel switches 22 of the functional logic are coupled to the data inputs of the down counter 18 and the results register 32. The output of the 1 Hz oscillator 16 is coupled to the clock input of the down counter 18 and to the clock input of the up counter 34. The data output terminals of the down counter 18, the up counter 34 and the front panel switches 22 are coupled to predetermined positions of the results register 32. These three data states are compared through a self test protocol to assure that the sum of the data outputs of the up counter 34 and the down counter 18 is always equal to the setting of the front panel switches 22. Any other result indicates to the central test control system that at least one of the components has failed.

The input AND/OR select circuit 24 receiving the complementary functional inputs and the complementary injected or test inputs generates a common output signal. A logic zero indicates that any one of the four inputs is in the active state. The output of the AND/OR select circuit 24 is coupled to the input of the 2 millisecond filter 26 and to the input of the latch 20, specifically at one input of an OR gate 40, the output of which is the inverted system output and the noninverted system output (through an inverter 42) of the time delay circuit.

According to the invention, the latch 20 is tested by application of a short pulse, generally on the order of 1 millisecond, through the complementary injection inputs of the AND/OR select circuit 24. The test pulse is intended to cause the latch 20 to momentarily change state for a period insufficient to cause regeneration which would force a stable state change of the latch 20. If the test pulse is sufficiently short the signal applied to the input of the 2 millisecond filter 26 and the signal in the feedback loop through a delay line 54 is not propagated so the flip-flop 20 does not latch and the down counter 18 does not reset. During normal operation, the functional input is applied through the 2 millisecond filter 26, through an OR gate 44, and thereafter through an OR gate 46 to the reset or "jam" input of the down counter 18 thereby to cause the data of the front panel switches 22 to be jammed into the down counter 18 for resetting the delay time.

The down counter 18 is operative to propagate a signal at zero count through an OR gate 48 and thence through an AND gate 50 to an input of the latch 20, specifically to one input of an AND gate 52. The output of AND gate 52 is coupled to the second input of the OR gate 40. The output of the OR gate 40 is cross-coupled through the delay line 54 to the second input of the AND gate 52. The delay line 54 assures that short pulses (less than about 15 milliseconds in length) are not recognized as true data by blocking short duration feedback regeneration in the flip-flop 20.

The carry output of the down counter 18 at the output terminal of OR gate 48 is coupled through the 100 millisecond filter 28 to the second input of OR gate 44 and thereby into the jam input of the down counter 18. This feedback line is provided to recycle the down counter 18 continuously during all operation of the functional logic. The purpose of the 100 millisecond filter 28 is to assure the validity of the output state of the down counter 18 for at least 100 milliseconds, the 100 millisecond filter allows enough time for the 15 millisecond latch 54 to latch when a time delay is valid.

In connection with the recycling of the counter through filter 28, the least significant bit (LSB) output of the down counter 18 is applied to one input of the AND/OR output select circuit 36 whereby the signal may be propagated to a central test control system. The least significant bit, when properly operating, will generate transitions at a rate of one per second. The time between transitions can be measured independently of the functional logic to verify the correct and accurate operation of the oscillator 16. A control line 58 is provided from one bit of the injection register 30 to select between inputs of the AND/OR output select circuit 36 when access to an oscillator check function is desired.

The 2 millisecond filter 26 provides an output indicating the presence of an active input signal through a line 60. The signal on line 60 is applied through an inverter gate to input hysteresis gate 62, the output of which is coupled to the second input of OR gate 48 and thereby to one input of the latch 20 and to the input of the 100 millisecond filter 28. The purpose of the hysteresis gate 62 is to prevent latch up of the latch 20 in the event the down counter 18 times out at the same time functional or test signal data are applied to the input of the AND/OR select circuit 24.

The purpose of the time delay circuit 10 is to propagate an active state as applied at functional inputs to the system output at a precisely predetermined time following the application of the functional input signal. In the present invention, all systems and components of the time delay circuit can be tested at any time during actual operation of the time delay system. In addition to actual continuous monitoring and testing of selected components, the system employs a 1 millisecond long injection test during which a selected data pattern can be applied through the injection register 30 and the test results are loaded into the results register 32. The test is activated when control logic 38 applies a signal to the input of AND gate 50 upon confluence of a test pulse and a card select signal. The AND gate 50 input, normally at a logical one state, goes to a logical zero state to activate the 1 millisecond test sequence.

The up counter 34 responds to the same signals applied to the down counter 18 and to the same signal output of the oscillator 16. The functional logic of the delay timer unit 11 and the self test circuit 12 are constructed on the same physical circuit board although physically and electronically isolated from one another. The system according to the invention has overlapping test functions to assure adequate redundancy of testing.

Turning to FIG. 2, there is shown a block diagram of the self test delay timer 10, such as described hereinabove in connection with a central test control 14. The self test delay timer 10 includes the delay timer unit 11 with the self test circuit 12, the self test circuit 12 being interconnected with a central test control 14. The central test control 14 includes, for use with a self tester 12, a counter check 15, a timer check 17 and a function check 19.

The counter check 15 is an adder and comparator which adds the data output of the up counter 34 and the down counter 18 as extracted from the results register 32 and compares the sum with the reading of the front panel switches 22, also extracted from the results register 32.

The timer check 17 examines the low frequency signal applied from the LSB of the down counter 18 through the AND/OR output select circuit 36 against at least one independently generated timing signal to assure that the oscillator 16 and down counter 18 are functioning within specification.

The function check 19 applies test signals during a 1 millisecond test sequence to the AND/OR select unit 24 to check for proper operation of the flip-flop 20 with the results as extracted from results register 32 and to check for the integrity of the functional signal line between the AND/OR select circuit 24 and the output of the flip-flop 20.

Suitable means are provided for test monitoring, for example, a test status output unit 13. The monitoring function may take the form of indicator lamps or the like.

The invention has now been explained with reference to a specific embodiment. Other embodiments will be apparent to those of ordinary skill in this art. It is not intended therefore that this invention be limited except as indicated by the appended claims.

We claim:

1. A self-testing apparatus for generating time delays comprising:

an input select circuit for receiving function input signals and test signals;

time delay generating means comprising a latchable flip-flop for generating an output signal at a preselected time delay in response to an input signal from said select circuit, said flip-flop including latch inhibiting means for preventing a stable state change in response to input signals of a duration shorter than a preselected interval;

an oscillator providing a continuous series of clock pulses;

a first counter connected to receive said clock pulses to provide a count thereof, said first counter having reset input;

a second counter connected to receive said clock pulses to provide a count thereof, said second counter having a reset input, said second counter being incremented in a sense opposite to said first counter;

a counter reset circuit for applying said input signals to said reset inputs of said first and second counters and a feedback circuit from an output of said first counter to said counter reset circuit including a low pass filter for inhibiting application of input signals of less than a predetermined duration to said reset inputs of said first and second counters;

an injection register for receiving a pattern of test signals and for applying said test signals to said input select circuit; and a results register connected to said first and second counters for comparing the counts therein.

2. The apparatus of claim 1 including means for applying a test signal to said flip-flop of a duration insufficient to latch said flip-flop for checking the integrity of said flip-flop and the input and output circuit thereof.

* * * * *